(12) United States Patent
Wendt et al.

(10) Patent No.: US 11,545,369 B2
(45) Date of Patent: Jan. 3, 2023

(54) METHOD OF FASTENING A SEMICONDUCTOR CHIP ON A LEAD FRAME, AND ELECTRONIC COMPONENT

(71) Applicant: OSRAM OLED GmbH, Regensburg (DE)

(72) Inventors: Mathias Wendt, Hausen (DE); Andreas Weimar, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 39 days.

(21) Appl. No.: 17/361,435

(22) Filed: Jun. 29, 2021

(65) Prior Publication Data
US 2021/0327725 A1    Oct. 21, 2021

Related U.S. Application Data

(62) Division of application No. 16/604,252, filed as application No. PCT/EP2018/059928 on Apr. 18, 2018, now Pat. No. 11,094,559.

(30) Foreign Application Priority Data

Apr. 20, 2017    (DE) ...................... 10 2017 108 422.3

(51) Int. Cl.
*H01L 21/48*    (2006.01)
*H01L 21/768*    (2006.01)
(Continued)

(52) U.S. Cl.
CPC .... *H01L 21/4846* (2013.01); *H01L 21/76885* (2013.01); *H01L 23/498* (2013.01);
(Continued)

(58) Field of Classification Search
CPC ............. H01L 21/4846; H01L 2021/60; H01L 2021/60007; H01L 2021/60015;
(Continued)

(56) References Cited

U.S. PATENT DOCUMENTS 8,240,545 B1    8/2012 Wang et al.
8,975,117 B2 *  3/2015 Otremba ................. H01L 24/29
                                                       438/118
(Continued)

FOREIGN PATENT DOCUMENTS

DE            195 32 250 A1    3/1997
DE     10 2015 114 088 A1    3/2017
(Continued)

OTHER PUBLICATIONS

Y.M. Liu et al., "Interfacial Reactions between Liquid Indium and Au-Deposited Substrates," Journal of Electronic Materials, vol. 29, No. 4, Apr. 2000, pp. 405—410.
(Continued)

*Primary Examiner* — Matthew E Warren
(74) *Attorney, Agent, or Firm* — DLA Piper LLP (US)

(57) ABSTRACT

An electronic component includes a lead frame; a semiconductor chip arranged above the lead frame; and a connection layer sequence arranged between the lead frame and the semiconductor chip, wherein the connection layer sequence includes a first intermetallic layer including gold and indium or gold, indium and tin, a second intermetallic layer including indium and a titanium compound, indium and nickel, indium and platinum or indium and titanium, and a third intermetallic layer including indium and gold.

13 Claims, 6 Drawing Sheets

(51) Int. Cl.
  *H01L 23/498* (2006.01)
  *H01L 23/00* (2006.01)
  *H01L 21/60* (2006.01)
(52) U.S. Cl.
  CPC .............. *H01L 24/04* (2013.01); *H01L 24/05* (2013.01); *H01L 24/82* (2013.01); *H01L 2021/60015* (2013.01); *H01L 2021/6027* (2013.01); *H01L 2021/60277* (2013.01)
(58) Field of Classification Search
  CPC ... H01L 2021/6027; H01L 2021/60277; H01L 21/76885; H01L 23/498; H01L 24/03; H01L 24/04; H01L 24/05; H01L 24/80; H01L 24/82; H01L 2924/14
  USPC ......... 257/666, 676, 782, 783; 438/118, 119
  See application file for complete search history.

(56) References Cited

U.S. PATENT DOCUMENTS

| | | |
|---|---|---|
| 2006/0214272 A1 | 9/2006 | Seki et al. |
| 2007/0126096 A1* | 6/2007 | Fu .................... H01L 23/49582 257/677 |
| 2007/0131734 A1* | 6/2007 | Hosseini ................. H01L 25/50 257/E21.705 |
| 2007/0197017 A1 | 8/2007 | Fujimoto et al. |
| 2008/0205013 A1 | 8/2008 | Oshika et al. |
| 2014/0097534 A1 | 4/2014 | Chang et al. |
| 2016/0027751 A1 | 1/2016 | Kim et al. |
| 2017/0018522 A1* | 1/2017 | Seddon ............. H01L 23/49811 |
| 2017/0018542 A1 | 1/2017 | Seddon et al. |
| 2017/0040492 A1* | 2/2017 | Chiu ....................... H01L 33/10 |

FOREIGN PATENT DOCUMENTS

| | | |
|---|---|---|
| WO | 2016/189148 A1 | 12/2016 |
| WO | 2017/032773 A1 | 3/2017 |

OTHER PUBLICATIONS

Thomas Studnitzky et al., "Diffusion Soldering for Stable High-Temperature Thin-Film Bonds," JOM: Journal of Metals, vol. 54, Issue 12, Dec. 2002, pp. 58—63.

German Examination Report dated Apr. 23, 2021 of counterpart German Application No. 11 2018 002 085.1 with English translation.

* cited by examiner

METHOD OF FASTENING A SEMICONDUCTOR CHIP ON A LEAD FRAME, AND ELECTRONIC COMPONENT

RELATED APPLICATIONS

This is a divisional of U.S. Ser. No. 16/604,252, filed Oct. 10, 2019, which is a § 371 of International Application No. PCT/EP2018/059928, with an international filing date of Apr. 18, 2018 (WO 2018/192987 A1, published Oct. 25, 2018), which is based on German Patent Application No. 10 2017 108 422.3, filed Apr. 20, 2017, the subject matter of which is incorporated by reference.

TECHNICAL FIELD

This disclosure relates to a method of attaching a semiconductor chip to a lead frame, and to an electronic component.

BACKGROUND

To connect a semiconductor chip to a lead frame, the semiconductor chips are often soldered to the lead frame during production of electronic components. Due to the difference in the thermal expansion behavior between the semiconductor chip and the material of the lead frame, tensions arise during cooling from the soldering temperature to room temperature in the composite of semiconductor chip and lead frame. These can lead to initiation of cracks, for example, in the carrier material of the semiconductor chip if the electronic component is subjected to mechanical load. For example, a gold-tin solder is used for soldering semiconductor chips to lead frames. With this solder the soldering temperature is around 300° C. Due to the high soldering temperature and the different thermal expansion behavior, considerable thermally induced mechanical loads occur during the cooling of the composite of lead frame and semiconductor chip. If the component is subjected to further mechanical load, this can lead to failure of the solder joint or to the initiation of cracks in the substrate or the solder joint. To ensure a good connection of the semiconductor chip to a lead frame, the solder must sufficiently wet the surface of the lead frame during soldering. A suitable surface of the lead frame is therefore required to be sufficiently wetted by the solder.

It could therefore be helpful to provide an improved method of attaching a semiconductor chip to a lead frame, and an electronic component.

SUMMARY

We provide a method of attaching a semiconductor chip on a lead frame including A) providing a semiconductor chip, B) applying a solder metal layer sequence to the semiconductor chip, wherein the solder metal layer sequence includes a first metallic layer comprising indium or an indium-tin alloy, C) providing a lead frame, D) applying a metallization layer sequence to the lead frame, wherein the metallization layer sequence includes a fourth layer including indium and/or tin arranged above the lead frame and a third layer including gold arranged above the fourth layer, E) forming an intermetallic intermediate layer including gold and indium, gold and tin or gold, tin and indium, G) applying the semiconductor chip to the lead frame via the solder metal layer sequence and the intermetallic intermediate layer, and H) heating the arrangement produced in G) to attach the semiconductor chip to the lead frame.

We also provide an electronic component including a lead frame; a semiconductor chip arranged above the lead frame; and a connection layer sequence arranged between the lead frame and the semiconductor chip, wherein the connection layer sequence includes: a first intermetallic layer including gold and indium or gold, indium and tin, a second intermetallic layer including indium and a titanium compound, indium and nickel, indium and platinum or indium and titanium, and a third intermetallic layer including indium and gold.

Figure 1A:
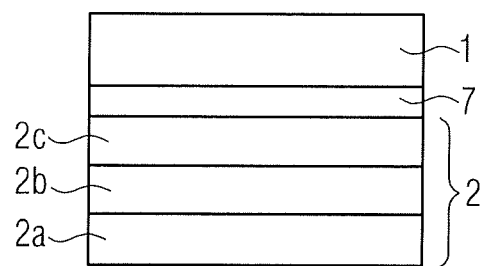
FIGS. 1A to 1E schematically show a method of producing an electronic component.
Figure 1A:
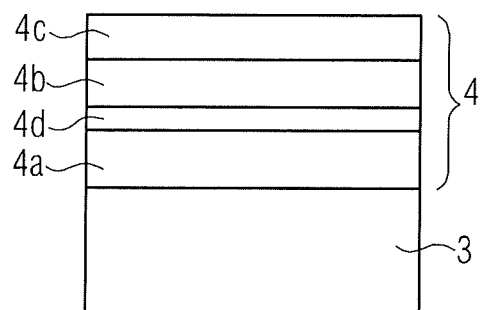

REFERENCE SIGNS 1 semiconductor chip
2 solder metal layer sequence
3 lead frame
4 metallization layer sequence
5 connection layer sequence
2a first metallic layer
2b barrier layer
2c second metallic layer
4a first layer
4b second layer
4c third layer
4d fourth layer
5a first intermetallic layer
5b second intermetallic layer
5c third intermetallic layer
6 intermetallic intermediate layer
100 electronic component

DETAILED DESCRIPTION

Our method comprises the following method steps, preferably in the specified order:
A) Providing a semiconductor chip.
B) Applying a solder metal layer sequence to the semiconductor chip, wherein the solder metal layer sequence comprises a first metallic layer comprising indium or an indium-tin alloy.
C) Providing a lead frame.
D) Applying a metallization layer sequence to the lead frame, wherein the metallization layer sequence comprises a fourth layer comprising indium and/or tin arranged above the lead frame and a third layer comprising gold arranged above the fourth layer. In particular, the fourth layer may also comprise an indium-tin alloy. The third layer can also consist of gold. The fourth layer may also consist of indium and/or tin. Particularly preferably, the fourth layer comprises indium or consists of indium.
E) Forming an intermetallic intermediate layer comprising gold and indium, gold and tin or gold, tin and indium. In particular, the intermetallic intermediate layer comprising gold and indium, gold and tin or gold, tin and indium may form at room temperature and thus immediately after application of the metallization layer sequence.

G) Applying the semiconductor chip to the lead frame via the solder metal layer sequence and the intermetallic intermediate layer. In particular, the application is carried out such that after application, the intermetallic intermediate layer and the solder metal layer sequence are located between the lead frame and the semiconductor chip.

H) Heating the arrangement produced under G) attach the semiconductor chip to the lead frame. In particular, the intermetallic intermediate layer and the solder metal layer sequence form a connection layer sequence in step H).

That a layer or an element is arranged or applied "to" or "above" another layer or another element may mean that the one layer or the one element is arranged directly in direct mechanical and/or electrical contact to the other layer or the other element. Furthermore, it can also mean that the one layer or the one element is arranged indirectly to or above the other layer or the other element. In this example, further layers and/or elements can then be arranged between the one or the other layer or between the one or the other element.

That a layer or an element is placed "between" two other layers or elements may mean that the one layer or the one element is arranged directly in direct mechanical and/or electrical contact or in indirect contact with one of the other two layers or elements and in direct mechanical and/or electrical contact or in indirect contact with the other of the other two layers or elements. In indirect contact, further layers and/or elements may then be arranged between one and at least one of the other two layers or between one and at least one of the other two elements.

Our process may comprise a method step F): heating the arrangement produced under D) to a temperature T1 higher than the melting point of tin and/or indium. According to this example, method step E) can be carried out after method step D) and before method step F) and/or after method step F). In other words, the intermetallic intermediate layer is formed after method step D) and before method step F), in particular at room temperature and/or after method step F). If method step E) is carried out after method step D) and before method step F), this can be referred to as method step E1). If method step E) is carried out after method step F), this can be referred to as method step E2). The semiconductor chips are preferably applied in method step G) to the lead frame heated from method step F).

The method may comprise the following steps, preferably in the specified order:
A) Providing a semiconductor chip.
B) Applying a solder metal layer sequence to the semiconductor chip, wherein the solder metal layer sequence comprises a first metallic layer comprising indium or an indium-tin alloy.
C) Providing a lead frame.
D) Applying a metallization layer sequence to the lead frame, wherein the metallization layer sequence comprises a fourth layer comprising indium and/or tin arranged above the lead frame and a third layer comprising gold arranged above the fourth layer. In particular, the fourth layer may also comprise an indium-tin alloy. The third layer can also consist of gold. The fourth layer may also consist of indium and/or tin. Particularly preferably, the fourth layer comprises indium or consists of indium.
E1) Forming an intermetallic intermediate layer comprising gold and indium, gold and tin or gold, tin and indium. In particular, the intermetallic intermediate layer comprising gold and indium, gold and tin or gold, tin and indium may form at room temperature and thus immediately after application of the metallization layer sequence.
F) Heating the arrangement produced under D) to a temperature T1 higher than the melting point of tin and/or indium.
E2) Forming an intermetallic intermediate layer comprising gold and indium, gold and tin or gold, tin and indium.
G) Applying the semiconductor chip to the lead frame via the solder metal layer sequence and the intermetallic intermediate layer. In particular, application is carried out such that after the application, the intermetallic intermediate layer and the solder metal layer sequence are located between the lead frame and the semiconductor chip.
H) Heating the arrangement produced under G) to attach the semiconductor chip to the lead frame. In particular, the intermetallic intermediate layer and the solder metal layer sequence form a connection layer sequence in step H).

The method may comprise the following steps, preferably in the specified order:
A) Providing a semiconductor chip.
B) Applying a solder metal layer sequence to the semiconductor chip, wherein the solder metal layer sequence comprises a first metallic layer comprising indium or an indium-tin alloy.
C) Providing a lead frame.
D) Applying a metallization layer sequence to the lead frame, wherein the metallization layer sequence comprises a fourth layer comprising indium and/or tin arranged above the lead frame and a third layer comprising gold arranged above the fourth layer. In particular, the fourth layer may also comprise an indium-tin alloy. The third layer can also consist of gold. The fourth layer may also consist of indium and/or tin. Particularly preferably, the fourth layer comprises indium or consists of indium.
F) Heating the arrangement produced under D) to a temperature T1 higher than the melting point of tin and/or indium.
E2) Forming an intermetallic intermediate layer comprising gold and indium, gold and tin or gold, tin and indium.
G) Applying the semiconductor chip to the lead frame via the solder metal layer sequence and the intermetallic intermediate layer. In particular, the application is carried out such that after application, the intermetallic intermediate layer and the solder metal layer sequence are located between the lead frame and the semiconductor chip.
H) Heating the arrangement produced under G) to attach the semiconductor chip to the lead frame. In particular, the intermetallic intermediate layer and the solder metal layer sequence form a connection layer sequence in step H).

The method may comprise the following steps:
A) Providing a semiconductor chip.
B) Applying a solder metal layer sequence to the semiconductor chip, wherein the solder metal layer sequence comprises a first metallic layer comprising indium or an indium-tin alloy.
C) Providing a lead frame.
D) Applying a metallization layer sequence to the lead frame, wherein the metallization layer sequence comprises a fourth layer comprising indium and/or tin arranged above the lead frame and a third layer comprising gold arranged above the fourth layer. In particular, the fourth layer may also comprise an indium-tin alloy. The third layer can also consist of gold. The fourth layer may also consist of indium and/or tin. Particularly preferably, the fourth layer comprises indium or consists of indium.
F) Heating the arrangement produced under D) to a temperature T1 higher than the melting point of tin and/or indium.

G) Applying the semiconductor chip to the lead frame via the solder metal layer sequence and the intermetallic intermediate layer. In particular, the application is carried out such that after application, the intermetallic intermediate layer and the solder metal layer sequence are located between the lead frame and the semiconductor chip.

H) Heating the arrangement produced under G) to attach the semiconductor chip to the lead frame. In particular, the intermetallic intermediate layer and the solder metal layer sequence form a connection layer sequence in step H).

An indium-tin alloy in the fourth layer of the metallization layer sequence can be formed in particular at room temperature by mixing the metals indium and tin. For example, to form the fourth layer, a layer of indium can first be provided to which a layer of tin is applied. It is also possible to first provide a layer of tin to which an indium layer is applied, wherein the fourth layer is formed at room temperature. An indium-tin alloy is advantageous since the melting point of the alloy to be formed is reduced compared to the melting point of indium at 156.6° C. and the melting point of tin at 231.9° C. As a result, the selected temperature T1 in method step E) can be kept low.

In method step E), tin and/or indium reacts with the gold of the third layer and an intermetallic intermediate layer is formed comprising gold and indium, gold and tin or gold, tin and indium. This intermetallic intermediate layer can be wetted very well with the indium or the indium-tin alloy of the first metallic layer in method step H) so that a very good and stable attachment of the semiconductor chip to the lead frame is possible. In particular, if the third layer is applied directly to the fourth layer, the indium and/or tin of the fourth layer already reacts at room temperature with the gold of the third layer in a method step E1).

The arrangement produced in method step D) may be heated in method step F) up to a temperature T1 of 350° C., preferably 270° C., particularly preferably 250° C. In particular, it is heated to a temperature T1, which is elevated by 30 to 60° C. relative to the melting temperature of indium, tin or an indium-tin alloy. It can thus be ensured that the indium and/or tin of the fourth layer melts and completely reacts with the gold of the third layer to form an intermetallic intermediate layer. In particular, metals of other layers such as nickel and palladium, can also react with the tin and/or indium melt and thus become part of the intermetallic intermediate layer.

The solder metal layer sequence may comprise the first metallic layer, a barrier layer arranged above the first metallic layer, and a second metallic layer arranged between the barrier layer and the semiconductor chip. The solder metal layer sequence can also consist of the first metallic layer, the barrier layer and the second metallic layer.

The solder metal layer sequence may comprise the first metallic layer comprising indium or an indium-tin alloy, a barrier layer arranged above the first metallic layer and a second metallic layer comprising gold arranged between the barrier layer and the semiconductor chip. After method step G), the first metallic layer is preferably arranged above the intermetallic intermediate layer, the barrier layer is arranged above the first metallic layer and the second metallic layer is arranged above the barrier layer. Preferably, the first metallic layer consists of indium or the indium-tin alloy. Preferably the second metallic layer consists of gold.

The metallization layer sequence may comprise a first layer comprising nickel arranged above the lead frame. The first layer preferably consists of nickel. The metallization layer sequence consists particularly preferably of the first layer, the fourth layer and the third layer.

The metallization layer sequence may comprise a first layer comprising nickel, a third layer comprising gold and a fourth layer comprising indium and/or tin. The fourth layer is preferably arranged between the first layer and the third layer. In this example, the first layer is arranged above the lead frame, the fourth layer above the first layer and the third layer above the fourth layer. After method step D) and in method step E1), an intermetallic intermediate layer comprising gold and indium; gold and tin or gold, indium and tin is preferably formed at room temperature according to this example. This example is preferred since there is already a direct contact between the third layer and the fourth layer in the metallization layer sequence. Thus, the intermetallic intermediate layer is formed already at room temperature so that a method step F) no longer has to take place.

The metallization layer sequence may comprise a first layer comprising nickel, a third layer comprising gold and a fourth layer comprising indium and/or tin. The fourth layer is preferably arranged between the first layer and the third layer. In this example, the first layer is arranged above the lead frame, the fourth layer is arranged above the first layer and the third layer is arranged above the fourth layer. After method step D) and in method step E1), an intermetallic intermediate layer comprising gold and indium; gold and tin or gold, indium and tin is preferably formed at room temperature according to this example. Preferably, a method step F) takes place after method step E1), wherein the tin and/or indium melt can react with the nickel of the first layer. After method step F) and in a method step E2), an intermetallic intermediate layer comprising gold, nickel and indium; gold, nickel and tin or gold, nickel, indium and tin is preferably formed according to this example. It is possible that the nickel of the first layer does not completely react with the tin and/or indium melt so that a first layer of reduced layer thickness remains. The intermetallic intermediate layer of this example has proven to be particularly well wettable by the indium or the indium-tin alloy of the first metallic layer in method step H).

The metallization layer sequence may comprise a second layer comprising palladium. The second layer preferably consists of palladium. The metallization layer sequence consists particularly preferably of the second layer, the fourth layer and the third layer. Very particularly preferably, the metallization layer sequence consists of the first layer, the second layer, the fourth layer and the third layer.

The metallization layer sequence may comprise a first layer comprising nickel, a second layer comprising palladium, a third layer comprising gold and a fourth layer comprising indium and/or tin. The metallization layer sequence can also consist of the first layer, the second layer, the third layer and the fourth layer.

The first layer may be arranged above the lead frame, the fourth layer is arranged above the first layer, the second layer is arranged above the fourth layer and the third layer is arranged above the fourth layer. After method step F) and in method step E2), an intermetallic intermediate layer comprising gold, nickel, palladium and indium; gold, nickel, palladium and tin or gold, nickel, palladium, indium and tin is preferably formed according to this example. The tin and/or indium melt thus reacts in method step E2) in addition to the reaction with the gold of the third layer with the nickel of the first layer and the palladium of the second layer. It is possible that the nickel of the first layer does not completely react with the tin and/or indium melt so that a first layer of reduced layer thickness remains. The intermetallic intermediate layer of this example can be wetted particularly well by the indium or the indium-tin alloy of the first metallic layer in method step H). This results in a particularly strong and permanent connection of the semiconductor chip to the lead frame. According to this example, no intermetallic intermediate layer is formed at room temperature since the third layer is not in direct contact with the fourth layer.

The metallization layer sequence may comprise a second layer comprising palladium, a third layer comprising gold and a fourth layer comprising indium and/or tin. In this example, the fourth layer is preferably arranged between the second layer and the third layer. In this example, the second layer is arranged above the lead frame, the fourth layer is arranged above the second layer and the third layer is arranged above the fourth layer. After method step D) and in method step E1), an intermetallic intermediate layer comprising gold and indium; gold, and tin or gold, indium and tin is preferably formed at room temperature. This example is preferred since there is already a direct contact between the third layer and the fourth layer in the metallization layer sequence. Thus, the intermetallic intermediate layer is formed already at room temperature so that a method step F) no longer has to take place.

The metallization layer sequence may comprise a second layer comprising palladium, a third layer comprising gold and a fourth layer comprising indium and/or tin. The fourth layer is preferably arranged between the second layer and the third layer. In this example, the second layer is arranged above the lead frame, the fourth layer is arranged above the second layer and the third layer is arranged above the fourth layer. After method step D) and in method step E1), an intermetallic intermediate layer comprising gold and indium; gold, and tin or gold, indium and tin is preferably formed at room temperature. Preferably, a method step F) takes place after method step E1), wherein the tin and/or indium melt can react with the palladium of the second layer. After method step F) and in a further method step E2), an intermetallic intermediate layer comprising gold, palladium and indium; gold, palladium and tin or gold, palladium, indium and tin is preferably formed according to this example. It is possible that the palladium of the second layer does not completely react with the tin and/or indium melt so that a second layer of reduced layer thickness remains. The intermetallic intermediate layer of this example has proven to be particularly well wettable by the indium or indium-tin alloy of the first layer.

The first layer may be arranged above the lead frame, the second layer may be arranged above the first layer, the fourth layer may be arranged above the second layer and the third layer may be arranged above the fourth layer. After method step D) and in method step E1), an intermetallic intermediate layer may comprise gold and indium; gold and tin or gold indium and tin is preferably formed at room temperature. This example is preferred because there is already a direct contact between the third layer and the fourth layer in the metallization layer sequence. Thus, the intermetallic intermediate layer is formed already at room temperature so that a method step F) no longer has to take place.

The first layer may be arranged above the lead frame, the second layer may be arranged above the first layer, the fourth layer may be arranged above the second layer and the third layer may be arranged above the fourth layer. After method step D) and in method step E1), an intermetallic intermediate layer comprising gold and indium; gold and tin or gold, indium and tin is preferably formed at room temperature. Preferably, a method step F) takes place after method step E1), wherein the tin and/or indium melt can react with the palladium of the second layer or with the palladium of the second layer and the nickel of the first layer. Preferably, after method step F) and in a method step E2), an intermetallic intermediate layer comprising gold, palladium and indium; gold, palladium and tin; gold, palladium, indium and tin; gold, nickel, palladium and indium; gold, nickel, palladium and tin or gold, nickel, palladium, indium and tin is formed. It is possible that the palladium of the second layer and/or the nickel of the first layer do not completely react with the tin and/or indium melt so that a second or first layer of reduced layer thickness remains. The intermetallic intermediate layer of this example can be wetted particularly well by the indium or the indium-tin alloy of the first metallic layer in method step H). This results in a particularly strong and permanent connection of the semiconductor chip to the lead frame.

The metallization layer sequence may comprise or consist of the first layer, the second layer, the third layer and two fourth layers. The first layer may be arranged above the lead frame, a fourth layer may be arranged above the first layer, the second layer may be arranged above the fourth layer, the fourth layer may be arranged above the second layer and the third layer may be arranged above the fourth layer. After method step D) and in method step E1), an intermetallic intermediate layer comprising gold, and indium, gold, tin and indium or gold, and tin, is preferably formed at room temperature. This example is preferred since there is already a direct contact between the third layer and the fourth layer in the metallization layer sequence. Thus, the intermetallic intermediate layer is formed already at room temperature so that a method step F) no longer has to take place.

The metallization layer sequence may comprise or consist of the first layer, the second layer, the third layer and two fourth layers. The first layer may be arranged above the lead frame, a fourth layer may be arranged above the first layer, the second layer may be arranged above the fourth layer, the fourth layer may be arranged above the second layer and the third layer may be arranged above the fourth layer. After method step D) and in method step E1), an intermetallic intermediate layer comprising gold, and indium, gold, tin and indium or gold, and tin, is preferably formed at room temperature. Preferably, a method step F) takes place after method step E1), wherein the tin and/or indium melt can react with the palladium of the second layer and the nickel of the first layer. After method step F) and in a method step E2), an intermetallic intermediate layer comprising gold, nickel, palladium and indium; gold, nickel, palladium and tin or gold, nickel, palladium, indium and tin intermetallic intermediate layer is preferably formed. The intermetallic intermediate layer of this example can be wetted particularly well by the indium or the indium-tin alloy of the first metallic layer in method step H). This results in a particularly strong and permanent connection of the semiconductor chip to the lead frame.

The arrangement produced in method step D) or E1) may be kept at temperature T1 for 5 minutes to 60 minutes, for example, for 20 minutes, after heating in method step F). A reaction of indium and/or tin with nickel and/or palladium is very slow and does not occur immediately after reaching the melting temperature. If the arrangement is kept at temperature T1 for a period of time from 5 minutes to 60 minutes, it can be ensured that, after liquefaction of the indium and/or tin, the nickel of the first layer and/or the palladium of the second layer and the gold of the third layer react with the indium and/or tin melt. If a direct contact of the fourth layer with the third layer already exists after method step D), an intermetallic intermediate layer comprising gold and tin; gold, indium and tin or gold and indium is formed at room temperature immediately after application of the metallization layer sequence in method step D) in a method step E1).

The first layer of the metallization layer sequence may have a layer thickness of 2 μm to 4 μm, for example, 3 μm.

The second layer of the metallization layer sequence may have a layer thickness of 10 nm to 20 nm.

The fourth layer of the metallization layer sequence may have a layer thickness of 10 nm to 5 μm, preferably 10 nm to 500 nm, particularly preferably 30 nm to 300 nm.

The third layer of the metallization layer sequence may have a layer thickness of 3 nm to 5 nm. If the metallization layer sequence comprises a first layer and/or a second layer, the fourth layer particularly has a layer thickness, at which the gold of the third layer completely and the nickel of the first layer and/or the palladium of the second layer at least partially react with the indium and/or tin melt. A partial reaction means that after the intermetallic intermediate layer is formed, a second layer and/or first layer with a reduced layer thickness remains.

In particular, the layer thicknesses of the individual layers of the metallization layer sequence are matched to one another such that in method step E) the indium and/or tin reacts off as completely as possible and it is ensured that the indium and/or tin reacts with the gold of the third layer and/or with the gold of the third layer and with the nickel of the first layer and/or with the palladium of the second layer.

The indium-tin alloy of the first metallic layer of the solder metal layer sequence and/or the indium-tin alloy of the fourth layer of the metallization layer sequence may have the formula $In_xSn_{1-x}$ with $0<x<1$, preferably with $0.5 \leq x < 1$. An indium-tin alloy of the first metallic layer of the solder metal layer sequence can be formed at room temperature by mixing the metals indium and tin.

The barrier layer of the solder metal layer sequence separates the metals of the first metallic layer, i.e., indium or indium and tin of the indium-tin alloy $In_xSn_{1-x}$, from the gold of the second metallic layer since both indium and the indium-tin alloy already produce a high-melting phase at room temperature with gold. Therefore, the first and the second metallic layer must first be separated from one another. Even after the melting temperature has been reached, the liquid indium or the liquid indium-tin alloy must be separated from the gold in method step H). This is done by the barrier layer. The barrier layer can also be referred to as a temporary diffusion barrier. The barrier layer is preferably arranged over the entire surface between the first metallic layer and the second metallic layer. In particular, the first metallic layer and the second metallic layer have no common interface.

The barrier layer may contain nickel, titanium or platinum. Nickel, titanium or platinum may be the metals or compounds of these metals. The titanium compound can be $Ti_yW_{y-1}$ or $Ti_zN_{z-1}$. The barrier layer preferably comprises or consists of the metals nickel, titanium or platinum, particularly preferably nickel. These metals or compounds are particularly advantageous since after melting the indium or the indium-tin alloy in method step H), they react only slowly and with a time delay with the liquid indium or the liquid indium-tin alloy, thus ensuring sufficient wetting of the intermetallic intermediate layer with the liquid indium or the liquid indium-tin alloy.

The arrangement produced in method step G) may be heated in method step H) up to a temperature T2 of 220° C., preferably 200° C., particularly preferably 190° C. Even at these temperatures, the indium or indium-tin alloy melts. Due to this comparatively low soldering temperature, hardly any thermally induced mechanical loads occur when cooling the arrangement of lead frame and semiconductor chip. As a result, a detachment of the semiconductor chip from the lead frame under mechanical loading is prevented and no cracks or hardly any cracks are produced in the event of mechanical loading.

The use of an indium-tin alloy $In_xSn_{1-x}$ in the first metallic layer of the solder metal layer sequence reduces the melting temperature compared to pure indium or pure tin. For example, the alloy $Sn_{0.48}In_{0.52}$ has a melting temperature of approximately 121° C. In particular, $Sn_{0.48}In_{0.52}$ forms the eutectic. As a result, it possible to keep the heating temperature lower than in known soldering processes. This leads to a reduction in stress due to the difference in thermal expansion behavior between the material of the semiconductor chip and the material of the lead frame.

During heating in method step H), the indium or the indium-tin alloy begins to melt. The surface of the intermetallic intermediate layer is wetted with the liquid indium or the liquid indium-tin alloy and reacts with the material of the intermetallic intermediate layer. Due to the indium and/or tin content of the intermetallic intermediate layer, this intermetallic intermediate layer shows very good wetting properties for the liquid indium or for the liquid indium-tin alloy. In particular, the wetting property is significantly better than that of a pure gold layer. At the same time, the indium or indium-tin alloy reacts with the material of the barrier layer, in particular nickel, titanium or platinum. This barrier layer initially delays the reaction of the indium or indium-tin alloy with the gold of the second metallic layer. This ensures that the intermetallic intermediate layer is sufficiently wetted by the liquid indium or the liquid indium-tin alloy. This would not be ensured if the indium or the indium-tin alloy would react immediately with the gold of the second metallic layer since this reaction would produce a high melting point phase and the indium or the indium-tin alloy would be liquid for an insufficiently long time to ensure a sufficient wetting of the intermetallic intermediate layer and a reaction with the material of the intermetallic intermediate layer. In addition, the intermetallic intermediate layer prevents the liquid indium or the liquid indium-tin alloy from withdrawing from the surface of the intermetallic intermediate layer as soon as the reaction with the gold of the second metallic layer begins. This is observed when a lead frame is only coated with a pure nickel layer and/or a pure palladium layer and a thin gold layer since the liquid indium or the liquid indium-tin alloy preferably reacts with the gold and thereby withdraws from the surface of the coated lead frame after the reaction with the thin gold layer on the lead frame and at the beginning of the reaction with the gold of the second metallic layer and thus no longer reacts with the nickel and/or palladium of the lead frame coating, resulting in an insufficient connection of the semiconductor chip to the lead frame. By the intermetallic intermediate layer, on the other hand, a sufficiently stable attachment of the semiconductor chip to the lead frame can be achieved since the intermetallic intermediate layer shows good wetting with the liquid indium or the liquid indium-tin alloy before and after the reaction of the liquid indium or the liquid indium-tin alloy with the gold of the second metallic layer.

A second intermetallic layer comprising or consisting of indium and the material of the barrier layer or indium, tin and the material of the barrier layer may be formed in method step H) from the reaction of the indium or the indium-tin alloy with the material of the barrier layer, in particular nickel, titanium or platinum. At the same time, a first intermetallic layer may be formed from the reaction of the indium or indium-tin alloy with the material of the intermetallic intermediate layer. In particular, the first metallic layer is arranged between the first and the second intermetallic layer. The remaining liquid indium or the liquid indium-tin alloy diffuses through the formed second intermetallic layer into the second metallic layer and reacts with the gold in an isothermal solidification reaction forming a high-melting solid phase, which is referred to as the third intermetallic layer. The third intermetallic layer comprises or consists of indium and gold or indium, tin and gold.

In method step H), a connection layer sequence may be formed between the lead frame and the semiconductor chip. The semiconductor chip may be attached to the lead frame via the connection layer sequence. The connection layer sequence may comprise a first intermetallic layer, a second intermetallic layer and a third intermetallic layer.

The first intermetallic layer may be arranged above the lead frame, the second intermetallic layer may be arranged above the first intermetallic layer and the third intermetallic layer may be arranged above the second intermetallic layer.

The intermetallic intermediate layer may comprise gold and indium, gold and tin or gold, tin and indium or may consist of these metals. The first intermetallic layer formed in method step H) may comprise gold and indium or gold, indium and tin or consists of these metals.

The intermetallic intermediate layer may comprise gold, nickel and indium; gold, nickel and tin or gold, nickel, indium and tin or consists of these metals. The first intermetallic layer formed in method step H) may comprise gold, nickel and indium or gold, nickel, indium and tin or consists of these metals.

The intermetallic intermediate layer may comprise or consist of gold, nickel, palladium and indium; gold, nickel, palladium and tin or gold, nickel, palladium, indium and tin. The first intermetallic layer formed in step H) may comprise or consist of gold, nickel, palladium and indium or gold, nickel, palladium, indium and tin.

The intermetallic intermediate layer may comprise gold, palladium and indium; gold, palladium and tin or gold, palladium, indium and tin or consists of these metals. The first intermetallic layer formed in step H) may comprise of gold, palladium and indium or gold, palladium, indium and tin or consist of these metals.

The barrier layer may have a thickness of 5 nm to 200 nm. With these layer thicknesses a sufficient delay of the reaction of the indium or the indium-tin alloy with the gold of the second metallic layer can be ensured to wet the intermetallic intermediate layer sufficiently with the liquid indium or the liquid indium-tin alloy.

The first metallic layer of the solder metal layer sequence may have a layer thickness of 750 nm to 3 µm.

In particular, the layer thicknesses of the individual layers of the solder metal layer sequence and the metallization layer sequence are matched to one another such that in method step H) the indium or the indium-tin alloy reacts off as completely as possible and it is ensured that the liquid indium or the liquid indium-tin alloy reacts with the gold of the second metallic layer of the solder metal layer sequence and the metals of the intermetallic intermediate layer. Thus, after method step H), the first intermetallic layer, the second intermetallic layer and the third intermetallic layer are preferably located between the semiconductor chip and the lead frame.

The second metallic layer of the solder metal layer sequence may have a layer thickness of 500 nm to 2 µm.

The lead frame can comprise copper.

The semiconductor chip may be a layer sequence with an active layer formed to emit electromagnetic radiation.

"Layer sequence" means a layer sequence comprising more than one layer, for example, a sequence of a p-doped and an n-doped semiconductor layer, wherein the layers are arranged one above the other, and at least one active layer emitting electromagnetic radiation is contained.

The layer sequence can be formed as an epitaxial layer sequence or as a radiation-emitting semiconductor chip with an epitaxial layer sequence, i.e., an epitaxially grown semiconductor layer sequence. The layer sequence can be formed on the basis of InGaAlN, for example. InGaAlN-based semiconductor chips and semiconductor layer sequences are in particular those, in which the epitaxially produced semiconductor layer sequence has a layer sequence of different individual layers, which contains at least one individual layer and has a material from the III-V compound semiconductor material system $In_xAl_yGa_{1-x-y}N$ with $0 \leq x \leq 1$, $0 \leq y \leq 1$ and $x+y \leq 1$. Semiconductor layer sequences that have at least one active layer based on InGaAlN can emit electromagnetic radiation in an ultraviolet to blue wavelength range, for example.

In addition to the active layer, the active semiconductor layer sequence can comprise other functional layers and functional regions such as p- or n-doped charge carrier transport layers, i.e., electron or hole transport layers, undoped or p- or n-doped confinement, cladding or waveguide layers, barrier layers, planarization layers, buffer layers, protective layers and/or electrodes as well as combinations thereof. Furthermore, one or more mirror layers can be applied on a side of the semiconductor layer sequence facing away from the growth substrate. The structures described here, concerning the active layer or the other functional layers and regions, are known particularly with regard to composition, function and structure and are therefore not explained in detail here.

Several semiconductor chips comprising an intermetallic intermediate layer may also be applied to a lead frame in method step G). After method step H), a method step for separating electronic components takes place, each comprising a semiconductor chip and a lead frame.

An electronic component comprising a lead frame and a semiconductor chip arranged above the lead frame may be obtained after method step H). Preferably, a connection layer sequence is arranged between the semiconductor chip and the lead frame. In particular, the semiconductor chip is attached to the lead frame via the connection layer sequence.

We also provide an electronic component. The electronic component is preferably produced by one of the methods specified in connection with one or more of the abovementioned examples. All features for the method are therefore also disclosed for the component and vice versa.

The component may be an optoelectronic component that generates radiation or light, in particular a light-emitting diode (LED).

An electronic component comprising a lead frame and a semiconductor chip arranged above the lead frame has a connection layer sequence arranged between the semiconductor chip and the lead frame. In particular, the semiconductor chip is attached to the lead frame via the connection layer sequence.

The connection layer sequence may comprise a first intermetallic layer, a second intermetallic layer and a third intermetallic layer. In particular, the first intermetallic layer is arranged above the lead frame, the second intermetallic layer is arranged above the first intermetallic layer and the third intermetallic layer is arranged above the second intermetallic layer. The connection layer sequence may also consist of the first, second and third intermetallic layers.

A first layer comprising or consisting of nickel may be arranged between the lead frame and the connection layer sequence, in particular between the lead frame and the first intermetallic layer.

A second layer comprising or consisting of palladium may be arranged between the first layer and the first intermetallic layer.

The first intermetallic layer of the connection layer sequence may comprise gold and indium; gold, tin and indium; gold, nickel, tin and indium; gold, palladium and indium; gold, palladium, tin and indium; gold, nickel, palladium and indium or gold, nickel, palladium, tin and indium or consists of these metals.

The second intermetallic layer may comprise indium and a titanium compound; indium and nickel; indium and platinum; indium and titanium; tin, indium and a titanium compound; tin, indium and nickel; Tin, indium and platinum or tin, indium and titanium or consists of indium and a titanium compound; indium and nickel; indium and platinum; indium and titanium; tin, indium and a titanium compound; tin, indium and nickel; tin, indium and platinum or tin, indium and titanium.

The third intermetallic layer of the connection layer sequence may comprise indium and gold or indium, tin and gold or consists of these metals.

An adhesive layer may be arranged between the semiconductor chip and the connection layer sequence. The adhesive layer can be formed from one or more metallic layers. For example, the metal may be selected from a group comprising platinum, titanium and gold. The adhesive layer serves on the one hand to attach the semiconductor chip to the solder metal layer sequence and on the other hand it serves as a diffusion barrier for the gold of the second metallic layer of the solder metal layer sequence or the third intermetallic layer.

The semiconductor chip may be arranged on a substrate. The substrate can, for example, be a sapphire or silicon substrate.

Further advantages and developments result from the examples described in the following in connection with the Figures. Same and similar or similar acting elements are provided with the same reference signs. The Figures and the proportions of the elements shown in the Figures are not to be regarded as true to scale. Rather, individual elements may be exaggeratedly large or simplified for better representability and/or better comprehensibility.

FIG. 1A shows a semiconductor chip 1, above which a solder metal layer sequence 2 is arranged. The solder metal layer sequence 2 comprises a first metallic layer 2a, a barrier layer 2b arranged above the first metallic layer 2a and a second metallic layer 2c arranged above the barrier layer 2b. In particular, the solder metal layer sequence 2 consists of the first metallic layer 2a, the barrier layer 2b and the second metallic layer 2c. The first metallic layer 2a comprises or consists of indium or an indium-tin alloy of the formula $In_xSn_{1-x}$, where $0<x<1$. The barrier layer 2b consists of nickel, titanium or platinum and the second metallic layer 2c consists of gold. The first metallic layer 2a has a layer thickness of 750 nm to 3 µm, the barrier layer has a layer thickness of 5 nm to 200 nm and the second metallic layer 2c has a layer thickness of 500 nm to 2 µm. An adhesive layer 7 is arranged between the semiconductor chip 1 and the solder metal layer sequence 2. The adhesive layer 7 can be formed from one or more metallic layers. For example, the metal may be selected from a group comprising platinum, titanium and gold. The adhesive layer 7 serves on the one hand to attach the semiconductor chip 1 to the solder metal layer sequence 2 and on the other hand it serves as a diffusion barrier for the gold of the second metallic layer 2c.

FIG. 1A also shows a lead frame 3 above which a metallization layer sequence 4 is arranged. The metallization layer sequence 4 consists of a first layer 4a arranged above the lead frame 3 comprising or consisting of nickel, a fourth layer 4d arranged above the first layer 4a comprising or consisting of indium and/or tin, preferably consisting of indium or indium and tin, a second layer 4b arranged above the fourth layer 4d comprising or consisting of palladium and a third layer 4c arranged above the second layer 4b comprising or consisting of gold. The first layer 4a has a layer thickness of, for example, 3 µm and the fourth layer 4d has a layer thickness of 10 nm to 5 µm, preferably 10 nm to 500 nm, particularly preferably 30 nm to 300 nm. The second layer 4b has a layer thickness of 10 nm to 20 nm and the third layer 4c has a layer thickness of 3 nm to 5 nm.

Alternatively, the metallization layer sequence 4 may have a further fourth layer comprising or consisting of indium and/or tin (not shown here). This is preferably arranged between the second layer 4b and the third layer 4c.

Figure 1B:
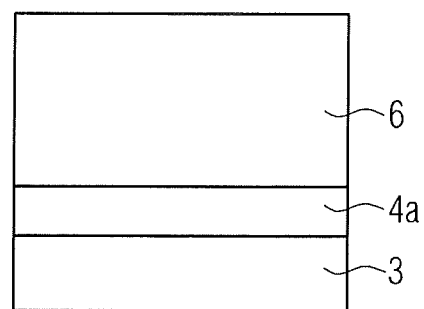

By heating the lead frame shown in FIG. 1A with the metallization layer sequence 4 to a temperature above the melting point of the indium and/or tin of the fourth layer 4d, the indium and/or tin in the fourth layer 4d melts. The indium and/or tin melt reacts with the nickel of the first layer 4a, the palladium of the second layer 4b and the gold of the third layer 4c. In particular, the layer thicknesses of layers 4a, 4b, 4c and 4d are matched to one another so that the gold of the third layer 4c reacts completely with the indium and/or tin melt. This reaction produces an intermetallic intermediate layer 6 as shown in FIG. 1B. The intermetallic intermediate layer 6 consists of gold, palladium, nickel and indium or of gold, palladium, nickel, tin and indium. Between the intermetallic intermediate layer 6 and the lead frame 3 there is a first layer 4a with a reduced layer thickness. It is also possible that the nickel of the first layer 4a reacts completely with the indium and/or tin melt and thus no first layer 4a remains (not shown here). The intermetallic intermediate layer 6 is then in direct mechanical contact with the lead frame 3 (not shown here).

Figure 1C:
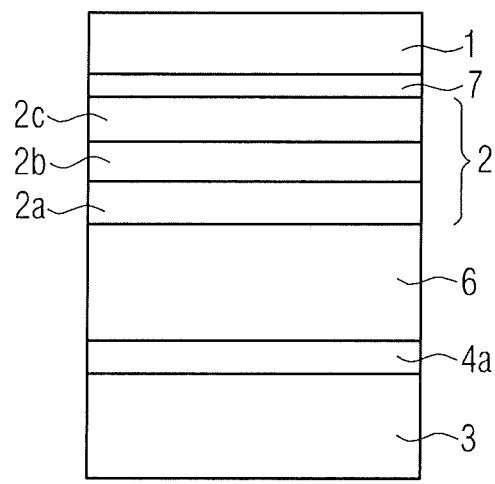

FIG. 1C shows an arrangement in which the semiconductor chip 1 is arranged on the lead frame 3 via the solder metal layer sequence 2 and the intermetallic intermediate layer 6.

Figure 1D:
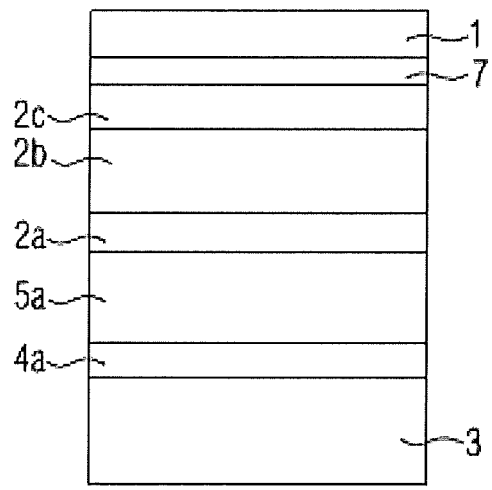

By heating the arrangement shown in FIG. 1C to a temperature of about 200° C., the indium or indium-tin alloy melts in the first metallic layer 2a. The liquid indium or the liquid indium-tin alloy wets the intermetallic intermediate layer 6. Due to the indium and/or tin content of the intermetallic intermediate layer 6, this intermetallic intermediate layer 6 shows very good wetting properties for the liquid indium or the liquid indium-tin alloy. The liquid indium or the liquid indium-tin alloy reacts with the nickel, platinum or titanium of barrier layer 2b and as shown in FIG. 1D, forms a second intermetallic layer 5b. At the same time the liquid indium or the liquid indium-tin alloy reacts with the gold, palladium, nickel and indium or the gold, palladium, nickel, tin and indium of the intermetallic intermediate layer 6 and forms a first intermetallic layer 5a.

Figure 1E:
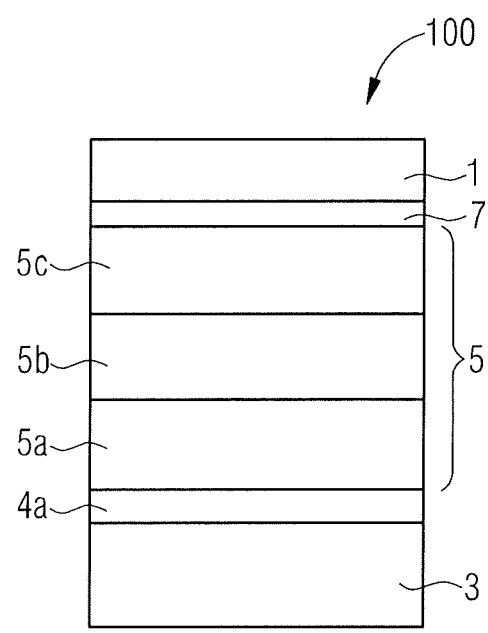

The liquid indium or the liquid indium-tin alloy of the first metallic layer 2a diffuses by a grain boundary diffusion through the second intermetallic layer 5b to the second metallic layer 2c and reacts there with the gold to form a third intermetallic layer 5c as shown in FIG. 1E. The indium and/or tin content of the intermetallic intermediate layer 6 prevents the liquid indium or the liquid indium-tin alloy from withdrawing from the surface of the intermetallic intermediate layer 6 as soon as the reaction with the gold of the second metallic layer 2c begins. The intermetallic intermediate layer 6 can thus achieve a sufficiently stable attachment of the semiconductor chip 1 to the lead frame 3 since the intermetallic intermediate layer 6 has a good wetting with the liquid indium or the liquid indium-tin alloy before and after the reaction of the liquid indium or the liquid indium-tin alloy with the gold of the second metallic layer 2c.

The electronic component 100 shown in FIG. 1E, in particular an optoelectronic component 100, comprises a lead frame 3, a first layer 4a arranged above the lead frame 3 comprising or consisting of nickel. A connection layer sequence 5 is arranged above the first layer. The connection layer sequence 5 comprises a first intermetallic layer 5a, a second intermetallic layer 5b arranged above the first intermetallic layer 5a, and a third intermetallic layer 5c arranged above the second intermetallic layer 5b. The semiconductor chip 1 is attached to the lead frame 3 via the connection layer sequence 5.

Figure 2A:
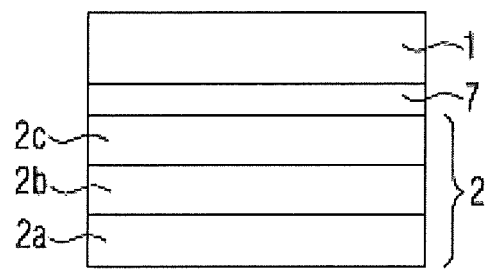
FIGS. 2A to 2E schematically show a method of producing an electronic component.
Figure 2A:
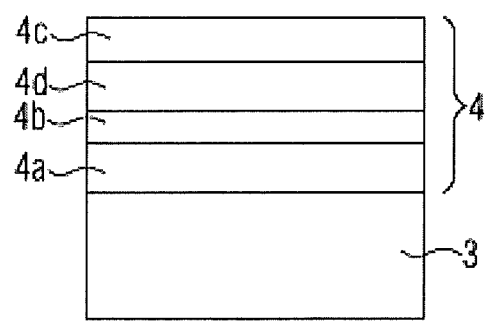

FIG. 2A shows a semiconductor chip 1, above which a solder metal layer sequence 2 is arranged. The structure is identical to the structure described in FIG. 1A.

FIG. 2A shows a lead frame 3 above which a metallization layer sequence 4 is arranged. The metallization layer sequence 4 consists of a first layer 4a comprising or consisting of nickel arranged above the lead frame 3, a second layer 4b comprising or consisting of palladium arranged above the first layer 4a, a fourth layer 4d comprising or consisting of indium and/or tin arranged above the second layer 4b, preferably consisting of indium or indium and tin, and a third layer 4c comprising or consisting of gold arranged above the fourth layer 4d. The first layer 4a has a layer thickness of, for example, 3 µm and the fourth layer 4d has a layer thickness of 10 nm to 5 µm, preferably 10 nm to 500 nm, particularly preferably 30 nm 300 nm. The second layer 4b has a layer thickness 10 nm to 20 nm and the third layer 4c has a layer thickness of 3 nm to 5 nm.

After applying the metallization layer sequence, the gold of the third layer 4c already reacts at room temperature with the indium and/or tin of the fourth layer forming an intermetallic intermediate layer consisting of indium and gold, indium, tin and gold or tin and gold (not shown). By heating the lead frame 3 shown in FIG. 2A with the metallization layer sequence 4 to a temperature above the melting point of the indium and/or tin of the fourth layer 4d, the indium and/or tin melts in the fourth layer 4d.

Figure 2B:
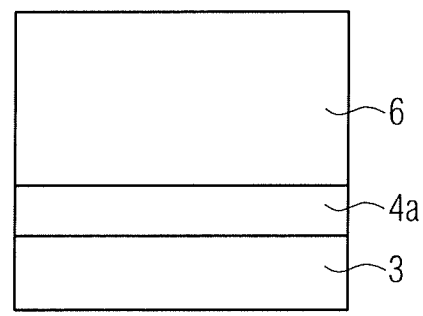

The indium and/or tin melt reacts with the nickel of the first layer 4a and the palladium of the second layer 4b and the gold of the third layer 4c, if this has not yet been completely reacted. In particular, the layer thicknesses of the layers 4a, 4b, 4c and 4d are matched to one another so that the gold of the third layer 4c reacts completely with indium and/or tin at room temperature or the indium and/or tin melt. Particularly preferably, layer thicknesses of the layers 4a, 4b, 4c and 4d are in addition matched to one another such that the nickel of the first layer 4a also reacts at least partially with the indium and/or tin melt. These reactions result in an intermetallic intermediate layer 6 as shown in FIG. 2B. The intermetallic intermediate layer 6 consists of gold, palladium, nickel and indium or of gold, palladium, nickel, tin and indium. A first layer 4a with a reduced layer thickness is located between the intermetallic intermediate layer 6 and the lead frame 3. It is also possible that the nickel of the first layer 4a reacts completely with the indium or tin melt and thus no first layer 4a remains (not shown here). The intermetallic intermediate layer 6 is then in direct mechanical contact with the lead frame 3 (not shown here).

Alternatively, the indium and/or tin melt reacts with the palladium of the second layer 4b and the gold of the third layer 4c. In particular, the layer thicknesses of the layers 4a, 4b, 4c and 4d are matched to one another so that the gold of the third layer 4c reacts completely with the indium and/or tin melt. These reactions result in an intermetallic intermediate layer 6. According to this example, the intermetallic intermediate layer 6 consists of gold, palladium and indium or of gold, palladium, tin and indium. Additionally, the first layer 4a is located between the intermetallic intermediate layer 6 and the lead frame 3. It is also possible that a second layer 4b of reduced layer thickness is located between the first layer 4a and the intermetallic intermediate layer 6.

Figure 2C:
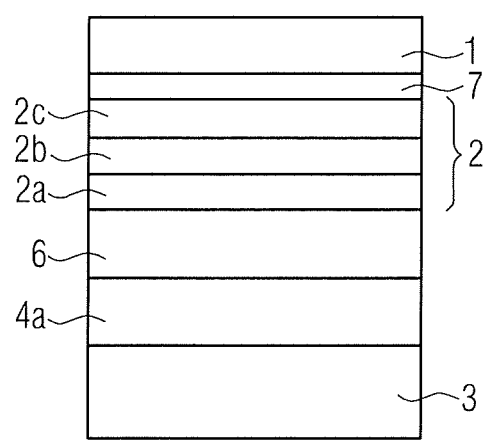

FIG. 2C shows an arrangement in which the semiconductor chip 1 is arranged on the lead frame 3 via the solder metal layer sequence 2 and the intermetallic intermediate layer 6.

Figure 2D:
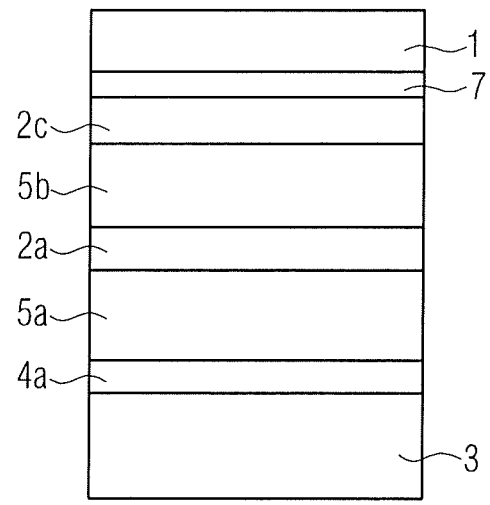

By heating the arrangement shown in FIG. 2C to a temperature of about 200° C., the indium or indium-tin alloy melts in the first metallic layer 2a. The liquid indium or the liquid indium-tin alloy wets the intermetallic intermediate layer 6. Due to the indium and/or tin content of the intermetallic intermediate layer 6, this intermetallic intermediate layer 6 shows very good wetting properties for the liquid indium or the liquid indium-tin alloy. The liquid indium or the liquid indium-tin alloy reacts with the nickel, platinum or titanium of barrier layer 2b and as shown in FIG. 2D forms a second intermetallic layer 5b. At the same time the liquid indium or the liquid indium-tin alloy reacts with the gold, palladium, nickel and indium or the gold, palladium, nickel, tin and indium of the intermetallic intermediate layer 6 and forms a first intermetallic layer 5a.

Figure 2E:
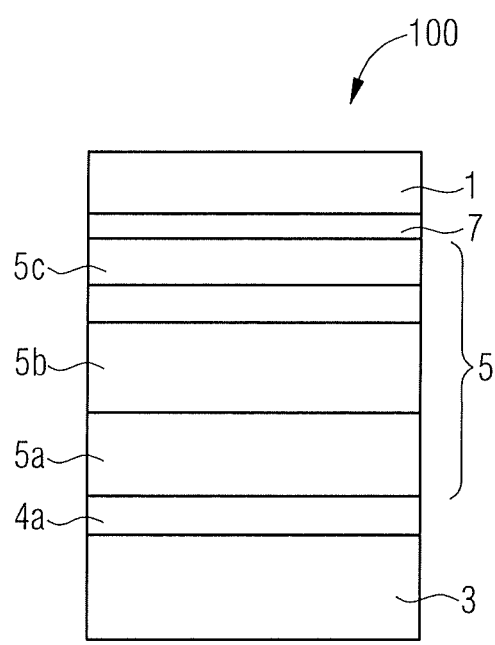

The liquid indium or the liquid indium-tin alloy of the first metallic layer 2a diffuses by a grain boundary diffusion through the second intermetallic layer 5b to the second metallic layer 2c and reacts there with the gold forming a third intermetallic layer 5c as shown in FIG. 2E. The indium and/or tin content of the intermetallic intermediate layer 6 also prevents the liquid indium or the liquid indium-tin alloy from withdrawing from the surface of the intermetallic intermediate layer 6 as soon as the reaction with the gold of the second metallic layer 2c begins. The intermetallic intermediate layer 6 thus achieves a sufficiently stable attachment of the semiconductor chip 1 to the lead frame 3 since the intermetallic intermediate layer 6 has good wetting properties with the liquid indium or the liquid indium-tin alloy before and after the reaction of the liquid indium or the liquid indium-tin alloy with the gold of the second metallic layer 2c.

The electronic component 100 shown in FIG. 2E, in particular an optoelectronic component 100, comprises a lead frame 3, a first layer 4a arranged above the lead frame 3 comprising or consisting of nickel. A connection layer sequence 5 is arranged above the first layer. The connection layer sequence 5 comprises a first intermetallic layer 5a, a second intermetallic layer 5b arranged above the first intermetallic layer 5a, and a third intermetallic layer 5c arranged above the second intermetallic layer 5b. The semiconductor chip 1 is attached to the lead frame 3 via the connection layer sequence 5.

Figure 3:
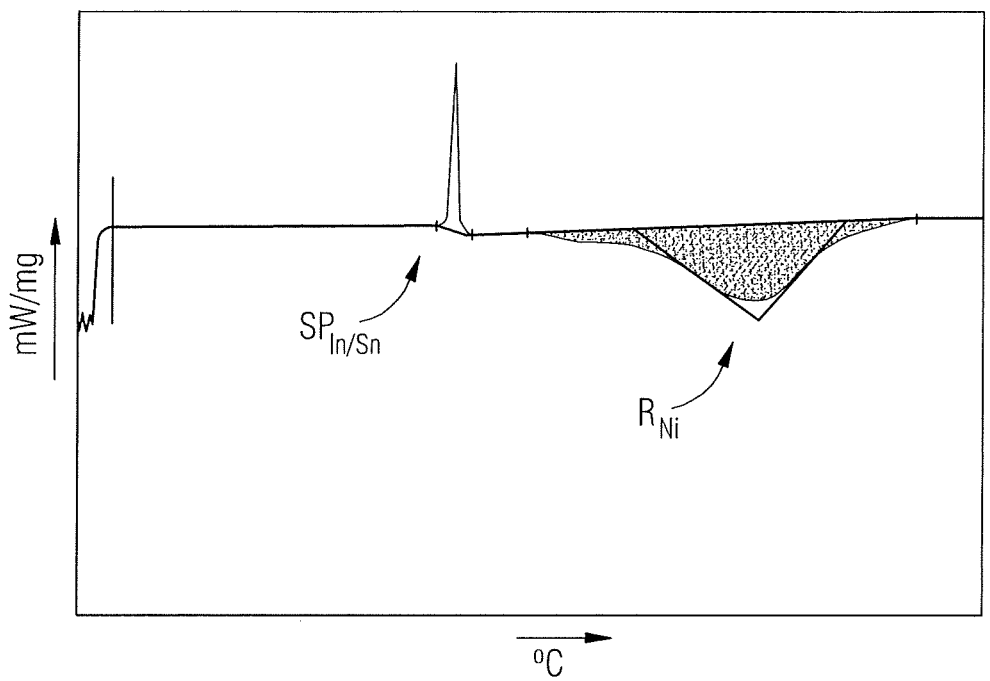
FIGS. 3 and 4 show dynamic differential calorimetry diagrams.
Figure 4:
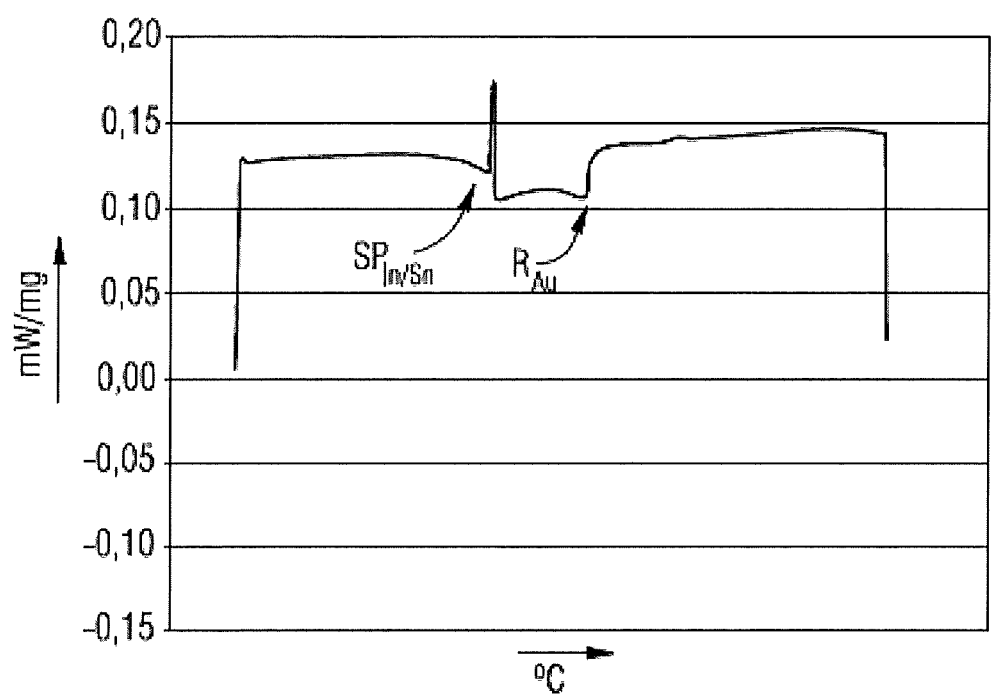

FIGS. 3 and 4 show dynamic differential calorimetry diagrams. The temperature in ° C. is indicated on the x-axis and mW/mg on the y-axis.

FIG. 3 shows the dynamic differential calorimetry diagram of the reaction of an indium-tin alloy $In_xSn_{1-x}$ with $0<x<1$ with nickel. $SP_{In/Sn}$ denotes the melting point of the indium-tin alloy and RN' denotes the reaction of the liquid indium-tin alloy with nickel. As can be seen, the reaction with the nickel takes place very slowly and does not occur immediately after reaching the melting temperature. For this reason, nickel is particularly suitable for its use in the barrier layer as it ensures that the intermetallic intermediate layer is sufficiently wetted with the liquid indium-tin alloy. In addition, it shows that for a reaction of the nickel of the first layer of the metallization layer sequence with the indium and/or tin of the fourth layer of the metallization layer sequence, the arrangement has to be kept sufficiently long at a temperature T1 above the melting temperature of indium and/or tin so that a corresponding reaction takes place between the nickel and the indium and tin melt.

FIG. 4 shows the dynamic differential calorimetry diagram of the reaction of an indium-tin alloy $In_xSn_{1-x}$ with $0<x\leq1$ with gold. $SP_{In/Sn}$ denotes the melting point of the indium-tin alloy and $R_{Au}$ denotes the reaction of the liquid indium-tin alloy with gold. As can be seen, the reaction of the gold takes place immediately after the indium-tin alloy has melted and the barrier is broken up. Thus, when using an excessively thin or no barrier layer, the intermetallic intermediate layer cannot be wetted or not sufficiently be wetted since the indium-tin alloy solidifies previously solidifies with the gold of the second metallic layer, forming a high-melting phase, before the wetting and the reaction with the metals of the intermetallic intermediate layer takes place.

The methods and components described here are not limited by the description on the basis of the examples. Rather, this disclosure comprises each new feature as well as each combination of features, which in particular comprises each combination of features in the appended claims, even if the feature or combination itself is not explicitly mentioned in the claims and examples.

The invention claimed is:

1. An electronic component comprising:
   a lead frame;
   a semiconductor chip arranged above the lead frame; and
   a connection layer sequence arranged between the lead frame and the semiconductor chip, wherein the connection layer sequence comprises:
   a first intermetallic layer comprising gold and indium or gold, indium and tin,
   a second intermetallic layer comprising indium and a titanium compound, indium and nickel, indium and platinum or indium and titanium, and
   a third intermetallic layer comprising indium and gold.

2. The electronic component according to claim 1, wherein
   the first intermetallic layer comprises gold, palladium and indium or gold, palladium, indium and tin,
   the second intermetallic layer comprises indium, tin and a titanium compound, indium, tin and nickel, indium, tin and platinum or indium, tin and titanium, and
   the third intermetallic layer comprises indium, tin and gold.

3. The electronic component according to claim 1, wherein
   the first intermetallic layer comprises gold, palladium, nickel and indium or gold, palladium, nickel, indium and tin,
   the second intermetallic layer comprises indium, tin and a titanium compound; indium, tin and nickel; indium, tin and platinum or indium, tin and titanium, and
   the third intermetallic layer comprises indium, tin and gold.

4. The electronic component according to claim 1, wherein the first intermetallic layer is arranged above the lead frame, the second intermetallic layer is arranged above the first intermetallic layer, and the third intermetallic layer is arranged between the second intermetallic layer and the semiconductor chip.

5. The electronic component according to claim 1, further comprising a first layer comprising nickel arranged between the lead frame and the first intermetallic layer.

6. The electronic component according to claim 5, further comprising a second layer comprising palladium arranged between the first layer and the first intermetallic layer.

7. The electronic component according to claim 1, further comprising an adhesive layer arranged between the semiconductor chip and the connection layer sequence.

8. The electronic component according to claim 7, wherein the adhesive layer is formed from one or more metallic layers selected from the group consisting of platinum, titanium and gold.

9. The electronic component according to claim 1, wherein the semiconductor chip is arranged on a substrate.

10. The electronic component according to claim 1, wherein the component is an optoelectronic component.

11. The electronic component according to claim 1, wherein the semiconductor chip comprises a layer sequence with an active layer formed to emit electromagnetic radiation.

12. The electronic component according to claim 11, wherein the layer sequence is formed on the basis of InGaAlN.

13. The electronic component according to claim 1, wherein the first intermetallic layer is arranged above the lead frame, the second intermetallic layer is arranged above the first intermetallic layer and the third intermetallic layer is arranged above the second intermetallic layer.

* * * * *